United States Patent [19]
Sumida

[11] Patent Number: 5,818,282
[45] Date of Patent: Oct. 6, 1998

[54] BRIDGE CIRCUITRY COMPRISING SERIES CONNECTION OF VERTICAL AND LATERAL MOSFETS

[75] Inventor: Wataru Sumida, Shiga, Japan

[73] Assignee: NEC Corporation, Tokyo, Japan

[21] Appl. No.: 797,313

[22] Filed: Feb. 7, 1997

[30] Foreign Application Priority Data

Feb. 7, 1996 [JP] Japan .................................... 8-020818

[51] Int. Cl.[6] .................................................... H03K 17/56
[52] U.S. Cl. .......................... 327/424; 327/423; 257/122; 257/124
[58] Field of Search .................................... 327/424, 423, 327/425, 427; 257/122, 129, 141, 124

[56] References Cited

U.S. PATENT DOCUMENTS

| | | | |
|---|---|---|---|
| 4,760,434 | 7/1988 | Tsuzuki et al. ...................... | 327/424 X |
| 5,464,993 | 11/1995 | Zambrano et al. .................. | 257/141 X |
| 5,608,235 | 3/1997 | Pezzani ................................ | 257/122 X |

*Primary Examiner*—Huan Hoang
*Attorney, Agent, or Firm*—Young & Thompson

[57] ABSTRACT

A field relaxation region of the second conductivity type is formed between the base region and a drain electrode contact portion at which the drain region contacts with a drain electrode but distanced from both the base region and the drain electrode contact portion and the field relaxation region is also separated via the drain region from the laterally extending portion of the semiconductor isolation region to form a drain current channel region between the field relaxation region and the laterally extending portion of the semiconductor isolation region and further the field relaxation region is electrically connected via an interconnection to the source region and the vertically extending portion of the semiconductor isolation region so that the field relaxation region and the semiconductor isolation region have the same potential as the source region whereby if the lateral MOS field effect transistor is reverse-biased by a voltage, then a first space charge region is formed which extend from a first p-n junction surface between the laterally extending portion of the semiconductor isolation region and the drain current channel region of the drain region toward the drain current channel region and a second space charge region is formed which extend from a second p-n junction surface between the field relaxation region and the drain current channel region of the drain region toward the drain current channel region for causing the first and second space charge regions to contact with each other to pinch the drain current channel region off.

2 Claims, 5 Drawing Sheets

BRIDGE CIRCUITRY COMPRISING SERIES CONNECTION OF VERTICAL AND LATERAL MOSFETS

BACKGROUND OF THE INVENTION

The present invention relates to a semiconductor integrated circuit, and more particularly to an improved bridge circuitry comprising series connection of vertical and lateral MOS field effect transistors.

A switching power source for converting AC input into DC output has been known in the art and has a circuit configuration as illustrated in FIG. 1. The switching power source has a circuit configuration as follows. An input circuit 41 is provided for receiving an AC input and rectifying and smoothing the AC input to generate rectified and smoothed DC. A current conversion circuit 42 is provided which is connected to the input circuit 41 for receiving the rectified and smoothed DC from the input circuit 41 and converting the rectified and smoothed DC into the AC An output circuit 44 is provided which is connected to the current conversion circuit 42 for receiving the AC from the current conversion circuit 42 and rectifying and smoothing the AC to generate a DC output. A control circuit 43 is further provided which is connected to the output side of the input circuit 41 for receiving the rectified and smoothed DC from the input circuit 41. The control circuit 43 is also connected to the output side of the output circuit 44 for receiving the DC output from the output circuit 44. The control circuit 43 is also connected to the current conversion circuit 42 for controlling the current conversion circuit 42 in accordance with the DC output and the rectified and smoothed DC. The current conversion circuit 42 has a switching circuit 45 and an isolation transformer 46. The switching circuit 45 is connected to the input circuit 41 and the control circuit 43. The switching circuit 45 is also connected through the isolation transformer 46 to the output circuit 44.

The switching circuit 45 has such a circuit configuration as illustrated in FIG. 2, wherein twin half bridge circuits 1 and 2 are connected in parallel to each other between first and second terminals T1 and T2 across which the rectified and smoothed DC from the input circuit 41 are applied. The first half bridge circuit 1 comprises first and second n-channel MOS field effect transistors Q1 and Q2 which are connected in series between the first and second terminals T1 and T2. The first n-channel MOS field effect transistor Q1 is connected to the first terminal T1 whilst the second n-channel MOS field effect transistor Q2 is connected to the second terminal T2. The first n-channel MOS field effect transistor Q1 has a gate electrode G1 which is applied with a gate control signal which controls switching operations of the first n-channel MOS field effect transistor Q1. The second n channel MOS field effect transistor Q2 has a gate electrode G2 which is applied with a gate control signal which controls switching operations of the second n-channel MOS field effect transistor Q2. The second half bridge circuit 2 comprises third and fourth n-channel MOS field effect transistors Q3 and Q4 which are connected in series between the first and second terminals T1 and T2. The third n-channel MOS field effect transistor Q3 is connected to the first terminal T1 whilst the fourth n-channel MOS field effect transistor Q4 is connected to the second terminal T2. The third n-channel MOS field effect transistor Q3 has a gate electrode G3 which is applied with a gate control signal which controls switching operations of the third n-channel MOS field effect transistor Q3. The fourth n-channel MOS field effect transistor Q4 has a gate electrode G4 which is applied with a gate control signal which controls switching operations of the second n-channel MOS field effect transistor Q4.

As described above, the rectified and smoothed DC from the input circuit 41 is applied across the first and second terminals T1 and T2. A third terminal T3 is provided between the first and second n channel MOS field effect transistors Q1 and Q2. A fourth terminal T4 is provided between the third and fourth n-channel MOS field effect transistors Q3 and Q4. From the third and fourth terminals T3 and T4, the AC is fetched and transmitted to the isolation transformer. Namely, the first and second terminals T1 and T2 serve as input terminals whilst the third and fourth terminals T3 and T4 serve as output terminals.

The above twin half bridge circuits may be integrated on a single semiconductor substrate by use of an integration MOS technique as disclosed in the Japanese laid-open patent publications Nos. 61-148881 and 5-226597.

A bridge circuit disclosed in the Japanese laid-open patent publication No. 5-226597 will be described with reference to FIG. 3 which is a fragmentary cross sectional elevation view illustrative of an integrated half bridge circuit comprising first and second n-channel MOS field effect transistors connected in series to each other and integrated on a semiconductor substrate.

A first n-channel MOSFET Q11 and a second n-channel MOSFET Q12 are integrated over a $n^{++}$-semiconductor substrate 3. A bottom $n^-$-epitaxial layer 4a is formed over the $n^{++}$-semiconductor substrate 3. A top n-epitaxial layer 4b is formed over the bottom $n^-$-epitaxial layer 4a. A p-pocket region 5 is selectively formed in an upper region of the bottom $n^-$-epitaxial layer 4a and below the top n-epitaxial layer 4b. The p-pocket region 5 extends within a region on which the second n-channel MOSFET Q12 is provided. A $p^+$-side pocket region 5a is provided which extends vertically from a peripheral region of the p-pocket region 5 up to a surface of the wafer or the same level as the top surface of the top n-epitaxial layer 4b. An $n^+$-drain region 6 is formed on the top surface of the bottom n-epitaxial layer 4a but only within a region on which the first n-channel MOSFET Q11 is provided. An $n^{++}$-side drain region 6a is provided which extends vertically from a peripheral portion of the $n^+$-drain region 6 up to the surface of the wafer or the same level as the top surface of the top n-epitaxial layer 4b. An n-drain region 7 is formed on the $n^+$-drain region 6 and inside the $n^{++}$-side drain region 6a so that the n-drain region 7 is surrounded by the $n^{++}$-side drain region 6a. A p-base region 8 is formed within the n-drain region 7 so that the p-base region 8 is surrounded by the n-drain region 7. $n^+$-source regions 9 are formed in a surface region of the p-base region 8. An $n^+$-drain region 10 is formed on the top surface of the p-pocket region 5. An $n^{++}$-side drain region 10a is formed which extends vertically from an end portion of the $n^+$-drain region 10 up to the surface of the wafer or the same level as the top surface of the top n-epitaxial layer 4b. An n-drain region 11 is formed, which extends over the $n^+$-drain region 10 and on an inside wall of the $n^{++}$-side drain region 10a as well as on a part of the p-pocket region 5 and an inside wall of the $p^+$-side pocket region 5a so that the n-drain region 11 is surrounded by the $n^+$-drain region 10, the $n^{++}$-side drain region 10a, the p-pocket region 5 and the $p^+$-side pocket region 5a. A p-base region 13 is formed in an upper region of the n-drain region 11 so that the p-base region 13 is surrounded by the n-drain region 11. $n^+$-source regions 12 are formed in an upper region of the p-base region 13. Gate insulation films 14 are formed on the p-base region 8 but only over its channel regions between the n-drain region 7 and the n⁺-source regions 9. Gate insulation films 15 are formed on the p-base region 13 but only over its channel regions between n-drain region 11 and the n⁺-source region 12. Gate regions 16 are provided on the gate insulation films 14. Gate regions 17 are provided on the gate insulation films 15. The gate regions 16 are connected to a gate electrode G11. The gate regions 17 are connected to a gate electrode G12. A first terminal T11 is provided on a bottom of the n⁺⁺-semiconductor substrate 3. A second terminal T12 is provided which is connected to the n⁺-source regions 12 of the second n-channel MOSFET Q12. The n⁺-source regions 9 of the first n-channel MOSFET Q11 are connected through a third terminal T13 to the n⁺⁺-side drain region 10a of the second n-channel MOSFET Q12.

The first n-channel MOSFET Q11 is provided so as to be electrically conductive to the n⁺⁺-semiconductor substrate 3 which is connected to the first terminal T11. In detail, the first n-channel MOSFET Q11 is connected via the drain regions comprising the n⁺-drain region 6, the n⁺⁺-side drain region 6a and n-drain region 7 and further through the bottom n-epitaxial layer 4a to the n⁺⁺-semiconductor substrate 3 connected to the first terminal T11. On the other hand, the second n-channel MOSFET Q12 is isolated by the p-pocket region 5 and p⁺-side pocket region 5a from the bottom n-epitaxial layer 4a and the n⁺⁺-semiconductor substrate 3. The n⁺-source regions 9 are connected through the third terminal T13 to the drain region of the second n-channel MOSFET Q12, namely to the n⁺-drain region 10, the n⁺⁺-side drain region 10a and the n-drain region 11. The n⁺-source regions 12 of the second n-channel MOSFET Q12 are connected to the second terminal T12. In summary, the first n-channel MOSFET Q11 and the second n-channel MOSFET Q12 are connected in series via the third terminal T13 to each other between the first terminal T11 and the second terminal T12 as well illustrated in FIG. 2 already referred in the above descriptions.

The third and fourth n-channel MOSFETS connected in series to each other via the fourth terminal between the first terminal T11 and the second terminal T12 may have the same structure as the first and second n-channel MOSFETS illustrated in FIG. 3, for which reason the substantially duplicate descriptions will be omitted.

By the way, the first n-channel MOSFET Q11 has a sufficiently high breakdown voltage of, for example, 2000 V. By contrast, the second n-channel MOSFET Q12 has a low breakdown voltage of, for example, 60–100 V. Since, in the bridge circuit, the first n-channel MOSFET Q11 and the second n-channel MOSFET Q12 are connected in series to each other, the breakdown voltage of the half bridge circuit is effectively defined by the breakdown voltage of the second n-channel MOSFET Q12, for example, 60–100 V. For that reason, the voltage level to be applied between the first and second terminals T11 and T12 is, therefore, restricted below the breakdown voltage of the second n-channel MOSFET Q12. Notwithstanding, it had actually been required to apply a much higher voltage level to between the first and second terminals T11 and T12.

In order to satisfy the above requirement, it was proposed to provide a large number of the second n-channel MOSFETS Q12 which are connected in series between the first n-channel MOSFET Q11 and the second terminal T12. The effective breakdown voltage of the series connection of the plural second n-channel MOSFETS Q12 is defined to be substantially the product of the number of the second n-channel MOSFET Q12 and the above breakdown voltage of the single second n-channel MOSFET Q12, for example, 60–100 V. In this case, however, another problem is raised with considerable increase in area of the circuit region on which the twin half bridge circuits are provided.

In the above circumstances, it had been required to develop novel MOS field effect transistors connected in series to form a half bridge circuit having a sufficiently high breakdown voltage and a small circuit shear area on which the MOS field effect transistors are formed.

SUMMARY OF THE INVENTION

Accordingly, it is an object of the present invention to provide novel MOS field effect transistors connected in series to form a half bridge circuit free from any problems as described above.

It is a further object of the present invention to provide novel MOS field effect transistors connected in series to form a half bridge circuit having a sufficiently high breakdown voltage.

It is a furthermore object of the present invention to provide novel MOS field effect transistors connected in series to form a half bridge circuit having a small circuit shear area on which the MOS field effect transistors are formed.

The above and other objects, features and advantages of the present invention will be apparent from the following descriptions.

The present invention provides a half bride circuitry comprising a vertical MOS field effect transistor and a lateral MOS field effect transistor which are connected in series between first and second input terminals which are applied with a DC voltage, the vertical MOS field effect transistor and the lateral MOS field effect transistor being integrated on a semiconductor substrate having a first conductivity type, the vertical MOS field effect transistor and the lateral MOS field effect transistor having channels of the first conductivity type, the lateral MOS field effect transistor having a drain region of a first conductivity type surrounded by a semiconductor isolation region having a second conductivity type and comprising a laterally extending portion and a vertically extending portion so that the drain region of the lateral MOS field effect transistor is isolated by the laterally extending portion of the semiconductor isolation region from the semiconductor substrate and also isolated by the vertically extending portion of the semiconductor isolation region from the vertical MOS field effect transistor. A base region of the second conductivity type is formed in an upper portion of the drain region and separated by the drain region from the semiconductor isolation region and the base region has an upper portion at which a source region is formed of the first conductivity type. A field relaxation region of the second conductivity type is formed between the base region and a drain electrode contact portion at which the drain region contacts with a drain electrode but distanced from both the base region and the drain electrode contact portion and the field relaxation region is also separated via the drain region from the laterally extending portion of the semiconductor isolation region to form a drain current channel region between the field relaxation region and the laterally extending portion of the semiconductor isolation region and further the field relaxation region is electrically connected via an interconnection to the source region and the vertically extending portion of the semiconductor isolation region so that the field relaxation region and the semiconductor isolation region have the same potential as the source region whereby if the lateral MOS field effect transistor is reverse-biased by a voltage, then a first space charge region is formed which extend from a first p-n junction surface between the laterally extending portion of the semiconductor isolation region and the drain current channel region of the drain region toward the drain current channel region and a second space charge region is formed which extend from a second p-n junction surface between the field relaxation region and the drain current channel region of the drain region toward the drain current channel region for causing the first and second space charge regions to contact with each other to pinch the drain current channel region off.

The present invention provides a drain structure of a lateral MOS field effect transistor integrated on a semiconductor substrate of a first conductivity type together with a vertical MOS field effect transistor to form a half bride circuitry, the drain region of a first conductivity type being surrounded by a semiconductor isolation region having a second conductivity type and comprising a laterally extending portion and a vertically extending portion so that the drain region is isolated by the laterally extending portion from the semiconductor substrate and also isolated by the vertically extending portion from the vertical MOS field effect transistor, wherein a base region of the second conductivity type is formed in an upper portion of the drain region and separated by the drain region from the semiconductor isolation region and the base region has an upper portion at which a source region is formed of the first conductivity type; and wherein a field relaxation region of the second conductivity type is formed between the base region and a drain electrode contact portion at which the drain region contacts with a drain electrode but distanced from both the base region and the drain electrode contact portion and the field relaxation region is also separated via the drain region from the laterally extending portion to form a drain current channel region between the field relaxation region and the laterally extending portion and further the field relaxation region is electrically connected via an interconnection to a source region and the vertically extending portion so that the field relaxation region and the semiconductor isolation region have the same potential as the source region whereby if the lateral MOS field effect transistor is reverse-biased, then a first space charge region is formed which extends from a first p-n junction surface between the laterally extending portion of the semiconductor isolation region and the drain current channel region of the drain region toward the drain current channel region and a second space charge region is formed which extends from a second p-n junction surface between the field relaxation region and the drain current channel region of the drain region toward the drain current channel region for causing the first and second space charge regions to contact with each other to pinch the drain current channel region off.

BRIEF DESCRIPTIONS OF THE DRAWINGS

Preferred embodiments of the present invention will be described in detail with reference to the accompanying drawings.

PREFERRED EMBODIMENT

Figure 1:
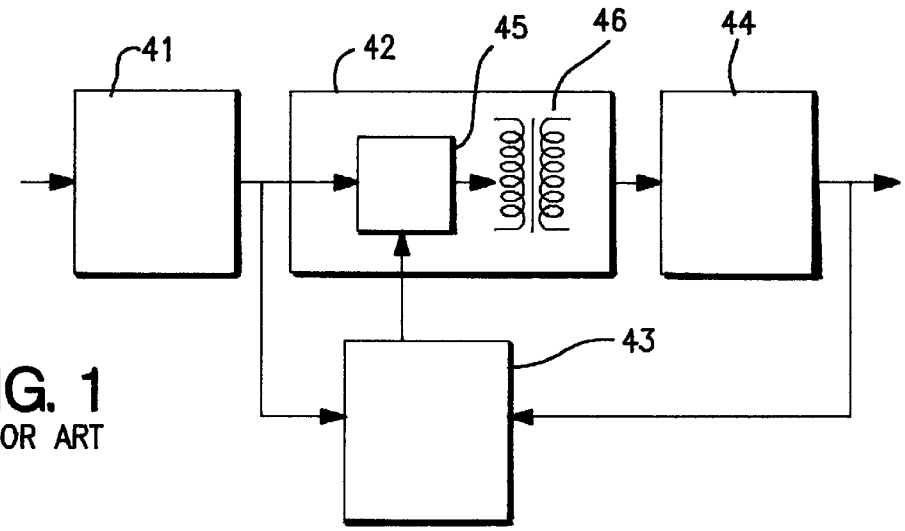
FIG. 1 is a block diagram illustrative of a switching power source for converting AC input into DC output.
Figure 2:
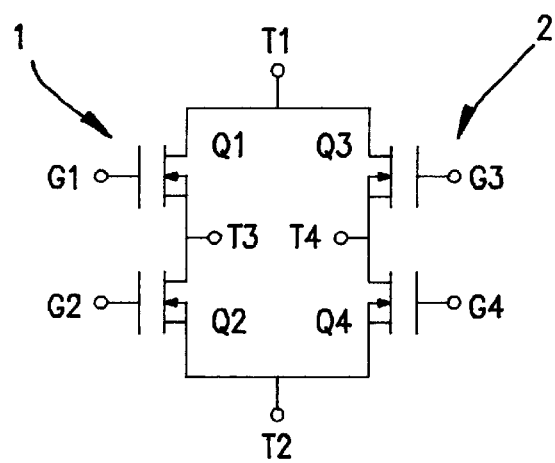
FIG. 2 is a circuit diagram illustrative of the conventional twin half bridge circuits as the switching circuit provided in a switching power source illustrated in FIG. 1.
Figure 3:
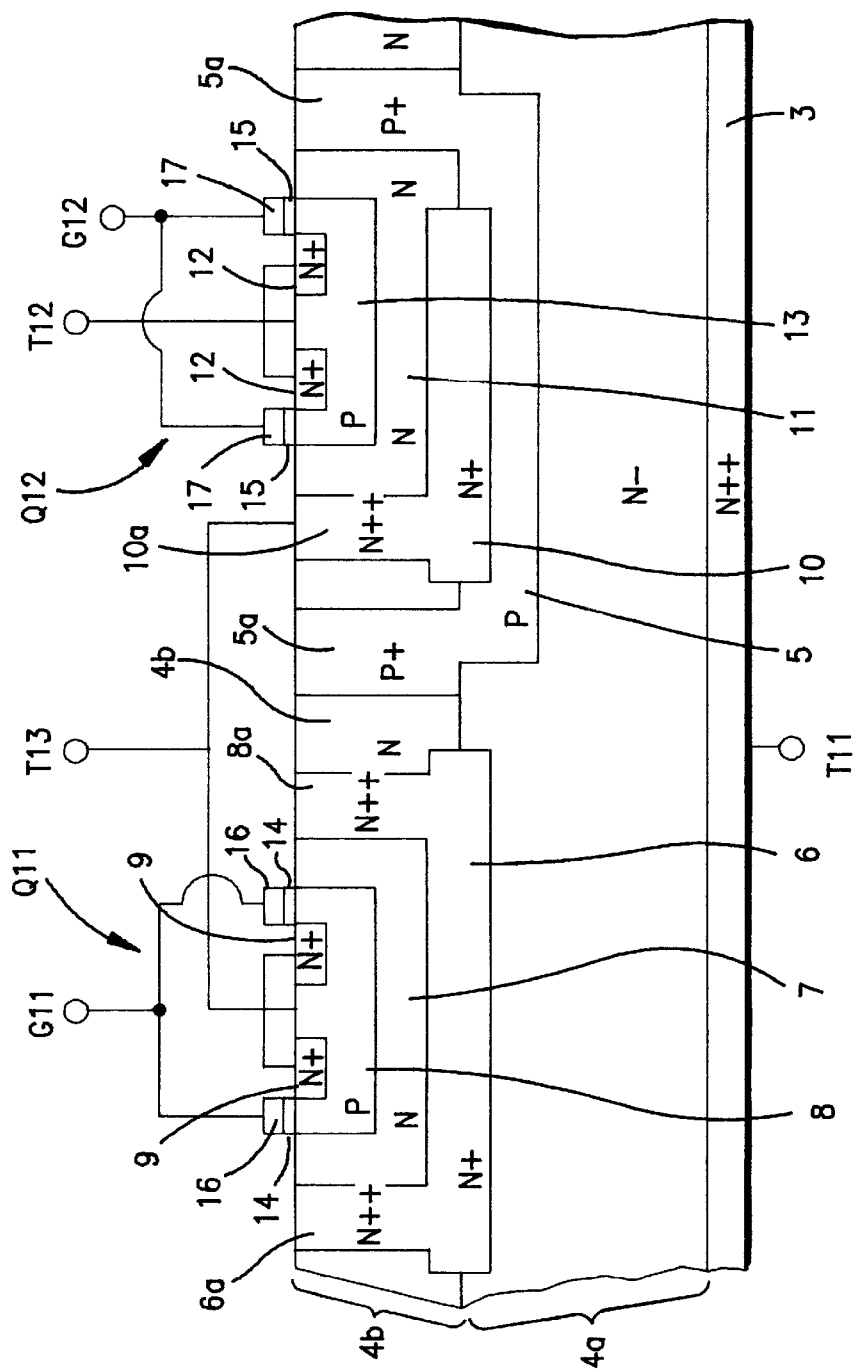
FIG. 3 is a fragmentary cross sectional elevation view illustrative of the conventional first and second n-channel MOSFETS connected in series to form one of the twin half bridge circuits as the switching circuit provided in a switching power source illustrated in FIG. 1.

A preferred embodiment according to the present invention will be described in detail with reference to FIGS. 4 and 5A through 5F, in which novel first and second n-channel MOSFETS are provided, which are connected in series to form one of twin half bridge circuits as a switching circuit provided in a switching power source. In the preferred embodiment, the same switching power source as illustrated in FIG. 1 and the same circuit configuration of the twin half bridge circuits as illustrated in FIG. 2 are used. Notwithstanding, the structure of the first and second n-channel MOSFETS integrated in the semiconductor substrate to form the half bridge circuit is different from that illustrated in FIG. 3. The half bridge circuit according to the present invention comprises a pair of vertical and lateral MOS field effect transistors connected in series to each other and integrated in a relatively small area of a semiconductor substrate. This half bridge circuit is, however, improved in the light of considerable increase in the breakdown voltage of the half bridge circuit.

Figure 4:
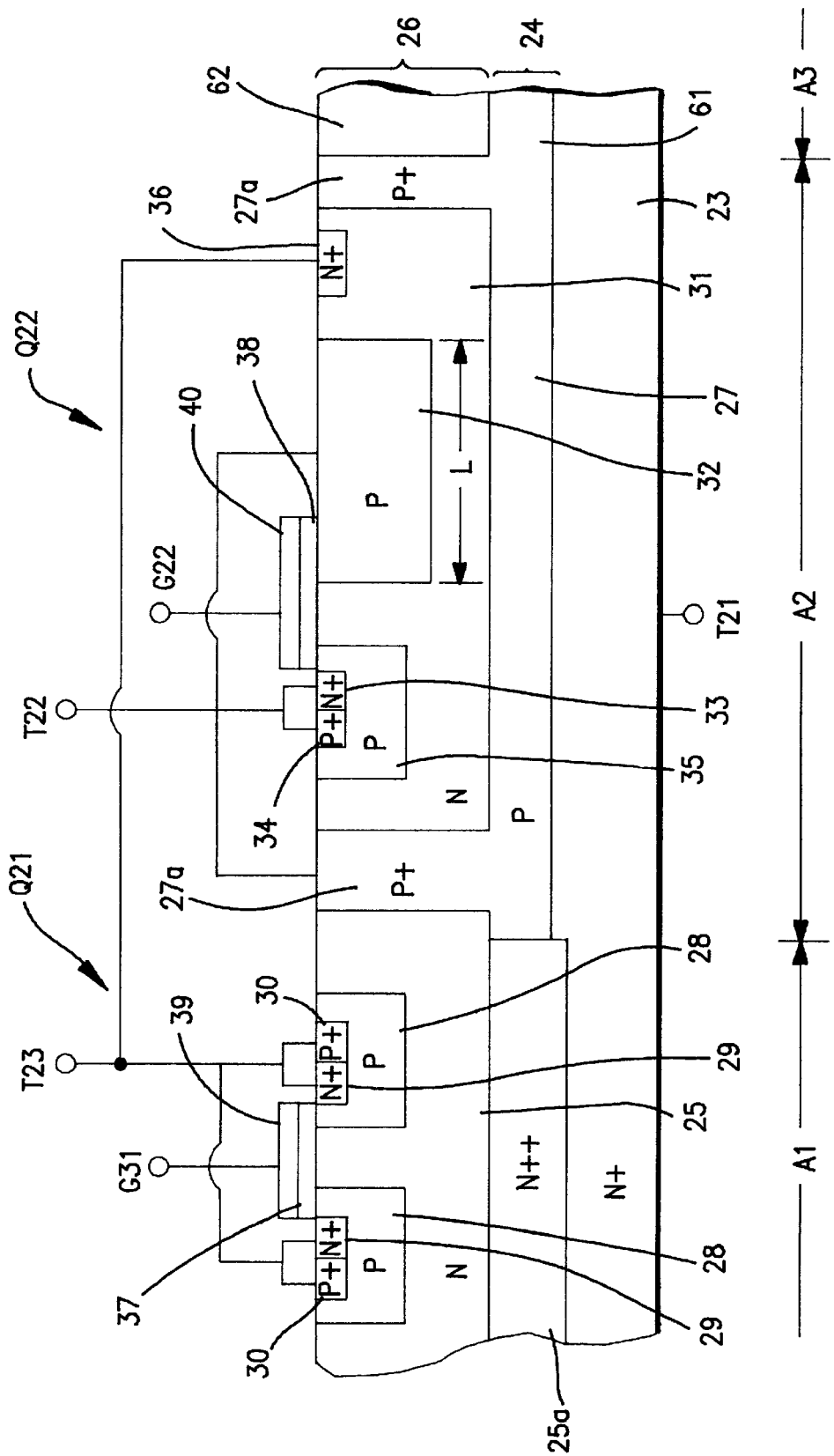
FIG. 4 is a fragmentary cross sectional elevation view illustrative of novel first and second n-channel MOSFETS connected in series to form one of twin half bridge circuits as a switching circuit provided in a switching power source in a preferred embodiment according to the present invention.

FIG. 4 is illustrative of novel first and second n-channel MOSFETS connected in series to form one of twin half bridge circuits as a switching circuit provided in a switching power source in a preferred embodiment according to the present invention. A first n-channel MOSFET Q21 and a second n-channel MOSFET Q22 are integrated over an $n^+$-semiconductor substrate 23, wherein the first n-channel MOSFET Q21 is provided in a first region A1 of the $n^+$-semiconductor substrate 23 whilst the second n-channel MOSFET Q22 is provided in a second region A2 of the $n^+$-semiconductor substrate 23. A control circuit illustrated in FIG. 1 is provided in a third region A3 of the $n^+$-semiconductor substrate 23. As will be apparent from the following descriptions, the first n-channel MOSFET Q21 is a vertical MOS field effect transistor whilst the second n-channel MOSFET Q22 is a lateral MOS field effect transistor in order to rise the breakdown voltage of the half bridge circuit. A p-epitaxial layer 24 is entirely formed over the $n^+$-semiconductor substrate 23. An n-epitaxial layer 26 is further formed over the p-epitaxial layer 24 to form a wafer which comprises laminations of the $n^+$-semiconductor substrate 23, the p-epitaxial layer 24 overlying the $n^+$-semiconductor substrate 23 and the n-epitaxial layer 26 overlying the p-epitaxial layer 24.

An $n^{++}$-region 25a is also selectively formed over the $n^+$-semiconductor substrate 23 but in the first region A1. A first n-drain region 25 is selectively formed on the $n^{++}$-region 25a formed in the first region A1. A first p-isolation region 27 is formed over the $n^+$-semiconductor substrate 23 so that the first p-isolation region 27 extends in the second region A2. A second p-isolation region 61 is formed over the $n^+$-semiconductor substrate 23 so that the second p-isolation region 61 extends in the third region A3. $p^+$-side isolation regions 27a are formed which extend vertically from a peripheral portion of the first p-isolation region 27 up to a surface of the wafer, namely, the p$^+$-side isolation regions 27a extend vertically at boundaries between the second region A2 and the first region A1 and between the second region A2 and the third region A3. First p-base regions 28 are selectively formed in an upper portion of the first n-drain region 25 so that the first p-base regions 28 are individually surrounded by the first n-drain region 25. First n$^+$-source regions 29 are selectively formed in upper regions of the first p-base regions 28 respectively whereby the first n$^+$-source regions 29 are separated by the first p-base regions 28 from the first n-drain region 25. First p$^+$-contact regions 30 are formed adjacent to but outside the first n$^+$-source regions 29 and selectively formed in the upper regions of the first p-base regions 28. An n-extended drain region 31 is formed on the first p-isolation region 27 and on inside walls of the p$^+$-side isolation region 27a so that the n-extended drain region 31 is surrounded by the first p-isolation region 27 and the p$^+$-side isolation region 27a. The first n-drain region 25 and the n$^{++}$-region 25a are provided in the first region A1 on which the first n-channel MOSFET Q21 of the vertical type is provided, whilst the n-extended drain region 31 is provided in the second region A2 on which the second n-channel MOSFET Q22 of the lateral type is provided. The n-extended drain region 31 is separated by the p$^+$-side isolation region 27a from the first n-drain region 25 and also separated by the first p-isolation region 27 from the n$^+$-semiconductor substrate 23. The first p-base regions 28 are provided in the first n-drain region 25 on the first region A1. A p-field relaxation region 32 having a lateral distance "L" is selectively formed in an upper portion of the n-extended drain region 31. A second p-base region 35 is selectively formed in an upper portion of the n-extended drain region 31 but separated by the n-extended drain region 31 from both the p-field relaxation region 32 and the p$^+$-side isolation region 27a. Namely, the second p-base region 35 is surrounded by the n-extended drain region 31. A second n$^+$-source region 33 is selectively formed in an upper region of the second p-base region 35 so that the second n$^+$-source region 33 is separated by the second p-base region 35 from the n-extended drain region 31. A p$^+$-contact region 34 is formed adjacent to the second n$^+$-source region 33 and in the upper region of the second p-base region 35 so that the p$^+$-contact region 34 is separated by the second p-base region 35 from the n-extended drain region 31. A second n$^+$-drain region 36 is selectively provided in an upper region of the n-extended drain region 31 but separated by the n-extended drain region 31 from both the p-field relaxation region 32 and the p$^+$-side isolation region 27a as well as from the second p-base region 35. Namely, the second n$^+$-drain region 36 is surrounded by the n-extended drain region 31. A control circuit region 62 is also formed over the second p-isolation region 61 and separated by the p$^+$-side isolation region 27a from the n-extended drain region 31. A gate insulation film 37 is formed on the top surface of the wafer but in the first region A1, wherein the gate insulation film 37 extends over the first n-drain region 25 but only a part thereof between the first p-base regions 28 and over the first p-base regions 28 but only inside portions thereof between the first n$^+$-source regions 29 and the first n-drain region 25. The gate insulation film 37 does not extend over the first n$^+$-source regions 29. A gate region 39 is formed on the gate insulation film 37. Of the first p-base regions 28, the inside portions under the gate insulation film serve as channel regions extending between the first n-drain region 25 and the first n$^+$-source regions 29. A gate insulation film 38 is formed over the top surface of the wafer but in the second region A2. The gate insulation film 38 extends over the n-extended drain region 31 but only a part thereof between the p-field relaxation region 32 and the second p-base region 35. The gate insulation film 38 further extends over second p-base region 35 but only an inside portion thereof between the n-extended drain region 31 and the second n$^+$-source region 33. The gate insulation film 38 furthermore extends over the p-field relaxation region 32 but only an adjacent part to the n-extended drain region 31. The gate insulation film 38 does not extend over the second n$^+$-source region 33. A gate region 40 is formed on the gate insulation film 38. A gate electrode G21 is provided which is connected to the gate region 39 provided in the first region A1. A gate electrode G22 is provided which is connected to the gate region 40. A first terminal T21 is connected to the n$^+$-semiconductor substrate 23. A second terminal T22 is connected to the second n$^+$-source region 33 of the second n-channel MOSFET Q22 of the lateral type. The first n$^+$-source regions 29 of the first n-channel MOSFET Q21 of the vertical type are connected via a third region A3 to the second n$^+$-drain region 36 of the second n-channel MOSFET Q22 of the lateral type.

As will be appreciated from the above descriptions, the first n-channel MOSFET Q21 of the vertical type and the second n-channel MOSFET Q22 of the lateral type are connected in series between the first terminal T21 and the second terminal T22 which are applied with the rectified and smoothed DC having been transmitted from the input circuit 41. Of the first n-channel MOSFET Q21 of the vertical type, the drain region comprising the first n-drain region 25 and the n$^{++}$-region 25a is connected via the n$^+$-semiconductor substrate 23 to the first terminal T21. Of the first n-channel MOSFET Q21 of the vertical type, the first n$^+$-source regions 29 are connected via the third terminal T23 to the drain region comprising the n-extended drain region 31 and the second n$^+$-drain region 36 of the second n-channel MOSFET Q22 of the lateral type. The second n$^+$-source region 33 of the second n-channel MOSFET Q22 of the lateral type is connected to the second terminal T22. The second n-channel MOSFET Q22 of the lateral type is isolated by the p$^+$-side isolation region 27a from the first n-channel MOSFET Q21 of the vertical type and also isolated by the first p-isolation region 27 from the n$^+$-semiconductor substrate 23 connected to the first terminal T21.

In the light of equivalent circuit, the above half bridge circuit is substantially the same as illustrated in FIG. 2. Another half bridge circuit is connected in series between the first terminal T21 and the second terminal T22. The other half bridge circuit is connected in parallel to the above described half bridge circuit comprising the first n-channel MOSFET Q21 and the second n-channel MOSFET Q22 connected in series to each other. The other half bridge circuit comprises a third n-channel MOSFET of the vertical type and a fourth n-channel MOSFET of the lateral type which are connected in series via a fourth terminal to each other between the first terminal T21 and the second terminal T22. The third n-channel MOSFET of the vertical type has the same structure as the first n-channel MOSFET Q21 of the vertical type illustrated in FIG. 4. The fourth n-channel MOSFET of the lateral type has the same structure as the second n-channel MOSFET Q22 of the lateral type illustrated in FIG. 4.

The switching power source circuit using the above twin half bridge circuits has substantially the same circuit configuration as illustrated in FIG. 1. Namely, the switching power source has a circuit configuration as follows. An input circuit 41 is provided for receiving an AC input and rectifying and smoothing the AC input to generate rectified and smoothed DC. A current conversion circuit 42 is provided which is connected to the input circuit 41 for receiving the rectified and smoothed DC from the input circuit 41 and converting the rectified and smoothed DC into the AC. An output circuit 44 is provided which is connected to the current conversion circuit 42 for receiving the AC from the current conversion circuit 42 and rectifying and smoothing the AC to generate a DC output. A control circuit 43 is further provided which is connected to the output side of the input circuit 41 for receiving the rectified and smoothed DC from the input circuit 41. The control circuit 43 is also connected to the output side of the output circuit 44 for receiving the DC output from the output circuit 44. The control circuit 43 is also connected to the current conversion circuit 42 for controlling the current conversion circuit 42 in accordance with the DC output and the rectified and smoothed DC. The current conversion circuit 42 has a switching circuit 45 and an isolation transformer 46. The switching circuit 45 is connected to the input circuit 41 and the control circuit 43. The switching circuit 45 is also connected through the isolation transformer 46 to the output circuit 44.

The insulation transformer 46 is provided between the third terminal T23 and the fourth terminal. Namely, a primary coil of the insulation transformer 46 is connected between the third terminal T23 and the fourth terminal. Between the first terminal T21 and the second terminal T22, the rectified and smoothed DC is applied, wherein the first terminal T21 is set to be the positive side. The control circuit 62 is connected to the gate electrodes of the first, second, third and fourth MOSFETS in the twin half bridge circuits. If a positive voltage higher than a predetermined voltage level is applied to the gate electrodes of the first and fourth n-channel MOSFETS but not applied to the second and third n-channel MOSFETS, then the first and fourth MOSFETS enter into the ON state whilst the second and third n-channel MOSFETS enter into the OFF state. As a result, the high voltage applied to the first terminal T21 appears on the third terminal T23 whilst the low voltage applied to the second terminal T22 appears on the fourth terminal. Since the first coil of the isolation transformer is connected between the third terminal T23 on which the high voltage appears and the fourth terminal on which the low voltage appears, a current flows from the third terminal T32 to the fourth terminal. If, however, a positive voltage higher than a predetermined voltage level is applied to the gate electrodes of the second and third n-channel MOSFETS but not applied to the first and fourth n-channel MOSFETS, then the second and third MOSFETS enter into the ON state whilst the first and fourth n-channel MOSFETS enter into the OFF state. As a result, the high voltage applied to the first terminal T21 appears on the fourth terminal whilst the low voltage applied to the second terminal T22 appears on the third terminal T23. Since the first coil of the isolation transformer is connected between the third terminal T23 on which the low voltage appears and the fourth terminal on which the high voltage appears, a current flows from the fourth terminal to the third terminal T32. As can be understood from the above descriptions, the above current conversion circuit 42 converts the rectified and smoothed DC into the AC.

It may be regarded that the reactance "L" of the isolation transformer 46 is connected between the third and fourth terminals, for which reason a considerably large counter electromotive force is generated. Accordingly, if the input circuit 41 is applied with an AC of 200V, each of the above first, second, third and fourth n-channel MOSFETS is required to have a higher breakdown voltage than 400V. The above first, second, third and fourth n-channel MOSFETS forming the twin half bridge circuits have higher breakdown voltage than 400V contrary to the conventional half bridge circuits. Since the first and third n-channel MOSFETS are of the vertical type, then the first and third n-channel MOSFETS have a breakdown voltage of 2000V much higher than the required breakdown voltage level of 400V. Whereas the second and fourth n-channel MOSFETS are of the lateral type, the second and fourth n-channel MOSFETS have a breakdown voltage higher than the required breakdown voltage level of 400V for the reasons which will hereinafter be described in detail with reference again to FIG. 4.

The second n-channel MOSFET Q22 of the lateral type is placed in the OFF state and if a DC voltage is applied to between the second $n^+$-drain region 36 of the second n-channel MOSFET Q22 and the second $n^+$-source region 33 of the second n-channel MOSFET Q22, wherein the high voltage is applied to the second $n^+$-drain region 36 whilst the low voltage is applied to the second $n^+$-source region 33. Namely, the second n-channel MOSFET Q22 is forward-biased. Since the second $n^+$-source region 33 connected via an interconnection to the $p^+$-side isolation region 27a and the first p-isolation region 27, the second $n^+$-source region 33 has the same potential as the $p^+$-side isolation region 27a and the first p-isolation region 27, for which reason a space charge region extends from a p-n junction between the first p-isolation region 27 and the n-extended drain region 31 into the inside of the n-extended drain region 31. Further, since the p-field relaxation region 32 is also connected via an interconnection to the $p^+$-side isolation region 27a and the first p-isolation region 27 and to the second $n^+$-source region 33, the p-field relaxation region 32 also has the same potential as the $p^+$-side isolation region 27a and the first p-isolation region 27 as well as the second $n^+$-source region 33, for which reason a further space charge region also extends from other p-n junction between the field relaxation region 32 and the n-extended drain region 31 into the inside of the n-extended drain region 31. As a result, the above two space charge regions extend from the p-isolation region 27 and from the field relaxation region 32 respectively so that the above two space charge regions come contact with each other over the n-extended drain region 31 between the p-isolation region 27 and the field relaxation region 32 whereby the drain current is pinched off under the field relaxation region 32. Thus, the p-isolation region 27 and the field relaxation region 32 are connected via the space charge region to each other. Namely, the n-extended drain region 31 is divided into two parts which are isolated from each other by the space charge region, for which reason the second $n^+$-source region 33 and the second $n^+$-drain region 36 are electrically disconnected from each other by the space charge region. If a high voltage is applied across the second n-channel MOSFET Q22 or between the second terminal T22 and third terminal T23, then the above two space charge regions are made into contact with each other to pinch the drain current off under the field relaxation region 32, for which reason the breakdown voltage is defined by the length "L" of the field relaxation region 32 under which the space charge regions pinches the drain current off. This means that the breakdown voltage of the second n-channel MOSFET Q22 is independent from the impurity concentration of the n-extended drain region 31, but depends upon the length "L" of the p-field relaxation region 32. This means that it is easy to control the breakdown voltage of the second n-channel MOSFET Q22 by controlling the length "L" of the field relaxation region 32.

Further, since the two space charge regions extend both from the p-field relaxation region 32 and from the first p-isolation region 27, it is possible to increase the impurity concentration of the n-extended drain region 31. The increase in impurity concentration of the n-extended drain region 31 reduces a resistivity of the n-extended drain region 31 whereby the resistance of the n-extended drain region 31 in the ON state is reduced. The reduction in resistance of the n-extended drain region 31 in the ON state allows a reduction in area of the second n-channel MOSFET Q22.

It is also possible to increase the breakdown voltage of the second n-channel MOSFET Q22 up to, for example, 1000 V by optimally selecting the thickness and the resistivity of the first p-isolation region 27 and the $p^+$-side isolation region 27a.

A method of fabricating the above half bridge circuit comprising the vertical and lateral n-channel MOSFETS Q21 and Q22 will hereinafter be described with reference to FIGS. 5A through 5F.

Figure 5A:
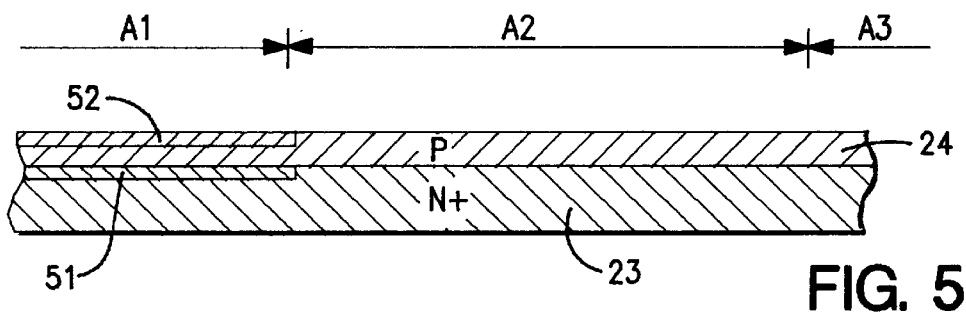
FIGS. 5A through 5F are fragmentary cross sectional elevation views illustrative of a semiconductor wafer on which novel first and second n-channel MOSFETS illustrated in FIG. 4 are integrated in sequential processes involved in a fabrication method in a preferred embodiment according to the present invention.

With reference to FIG. 5A, a photo-lithography method, an ion-implantation method and subsequent thermal diffusion method are carried out to selectively form an $n^{++}$-buried layer 51 in an upper region of the $n^+$-semiconductor substrate 23 but only in the first region A1 on which the first n-channel MOSFET Q21 of the vertical type will be formed. A p-epitaxial layer 24 is epitaxially formed which extends over the $n^{++}$-buried layer 51 and the $n^+$-semiconductor substrate 23. A photo-lithography method, a subsequent ion-implantation method and subsequent thermal diffusion method are carried out to selectively form an $n^{++}$-diffusion layer 52 in an upper region of the p-epitaxial layer 24.

Figure 5B:
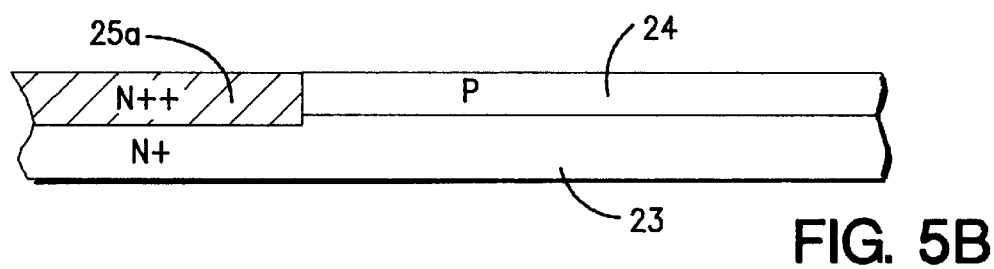

With reference to FIG. 5B, a thermal diffusion method is used for expansions of the $n^{++}$-buried layer 51 and the $n^{++}$-diffusion layer 52 to form an $n^{++}$-buried layer 25a which extends in the first region A1 and over the $n^+$-semiconductor substrate 23.

Figure 5C:
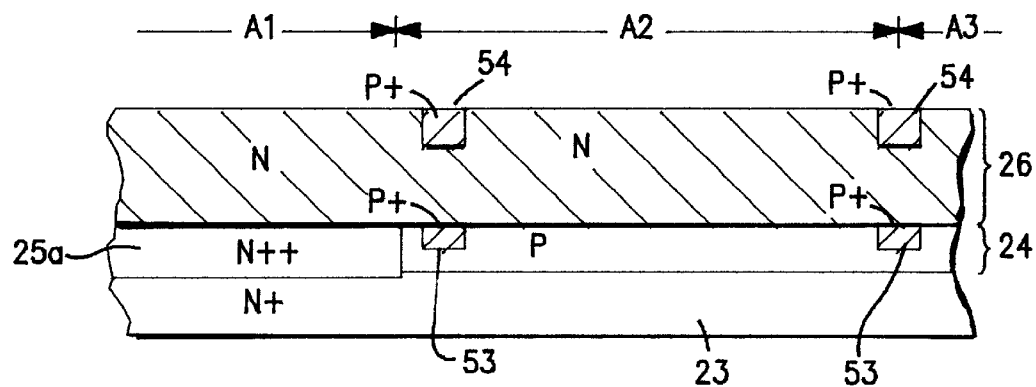

With reference to FIG. 5C, a photo-lithography method, an ion-implantation method and subsequent thermal diffusion method are carried out to selectively form $p^+$-buried layers 53 in an upper region of the p-epitaxial layer 24 but in the second region at a portion adjacent to the boundary between the first and second regions A1 and A2 as well as at a boundary between the second and third regions A2 and A3. A second n-epitaxial layer 26 is epitaxially formed on an entire surface of the wafer so that the second n-epitaxial layer 26 extends over the $n^{++}$-region 25a and the p-epitaxial layer 24. A photo-lithography method, a subsequent ion-implantation method and subsequent thermal diffusion method are carried out to selectively form $p^+$-diffusion layers 54 in an upper region of the second n-epitaxial layer 26 but in the second region A2 at a portion adjacent to the boundary between the first and second regions A1 and A2 as well as at a boundary between the second and third regions A2 and A3, whereby the $p^+$-diffusion layers 54 are positioned right above the $p^+$-buried layers 53.

Figure 5D:
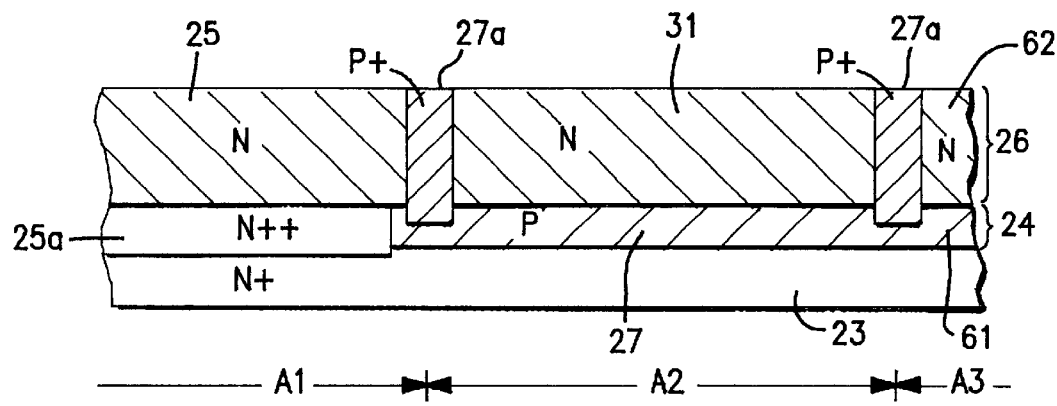

With reference to FIG. 5D, a thermal diffusion method is used for vertical extension of the $p^+$-diffusion layers 54 and the $p^+$-buried layers 53 to form $p^+$-side isolation regions 27a. The p-epitaxial layer 24 in the second region A2 is made into a first p-isolation region 27, whilst the p-epitaxial layer 24 in the third region A3 is made into a second p-isolation region 61. The second n-epitaxial layer 26 in the second region A2 and defined between the $p^+$-side isolation regions 27a is made into an n-extended drain region 31. first n-drain region 25 The second n-epitaxial layer 26 in the first region A1 and separated by the $p^+$-side isolation region 27a from the n-extended drain region 31 is made into a first n-drain region 25. The second n-epitaxial layer 26 in the third region A3 is made into a control circuit region 62.

Figure 5E:
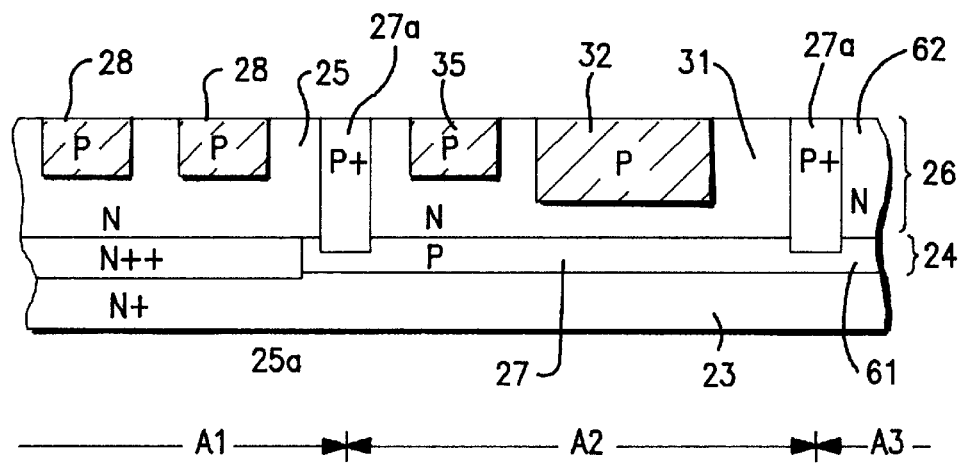

With reference to FIG. 5E, a photo-lithography method, an ion-implantation method and subsequent thermal diffusion method are carried out to selectively form first p-base regions 28 in an upper region of the first n-drain region 25 in the first region A1 as well as selectively form a second p-base region 35 in an upper region of the n-extended drain region 31 in the second region A2. The first p-base regions 28 are separated from each other by the first n-drain region 25. A further photo-lithography method, a subsequent ion-implantation method and subsequent thermal diffusion method are carried out to selectively form a p-field relaxation region 32 in an upper region of the n-extended drain region 31 in the second region A2 so that the p-field relaxation region 32 is positioned between the second p-base region 35 and the $p^+$-side isolation region 27a at the boundary between the second and third regions A2 and A3. The p-field relaxation region 32 is separated by the n-extended drain region 31 from the second p-base region 35 and from the $p^+$-side isolation region 27a at the boundary between the second and third regions A2 and A3.

Figure 5F:
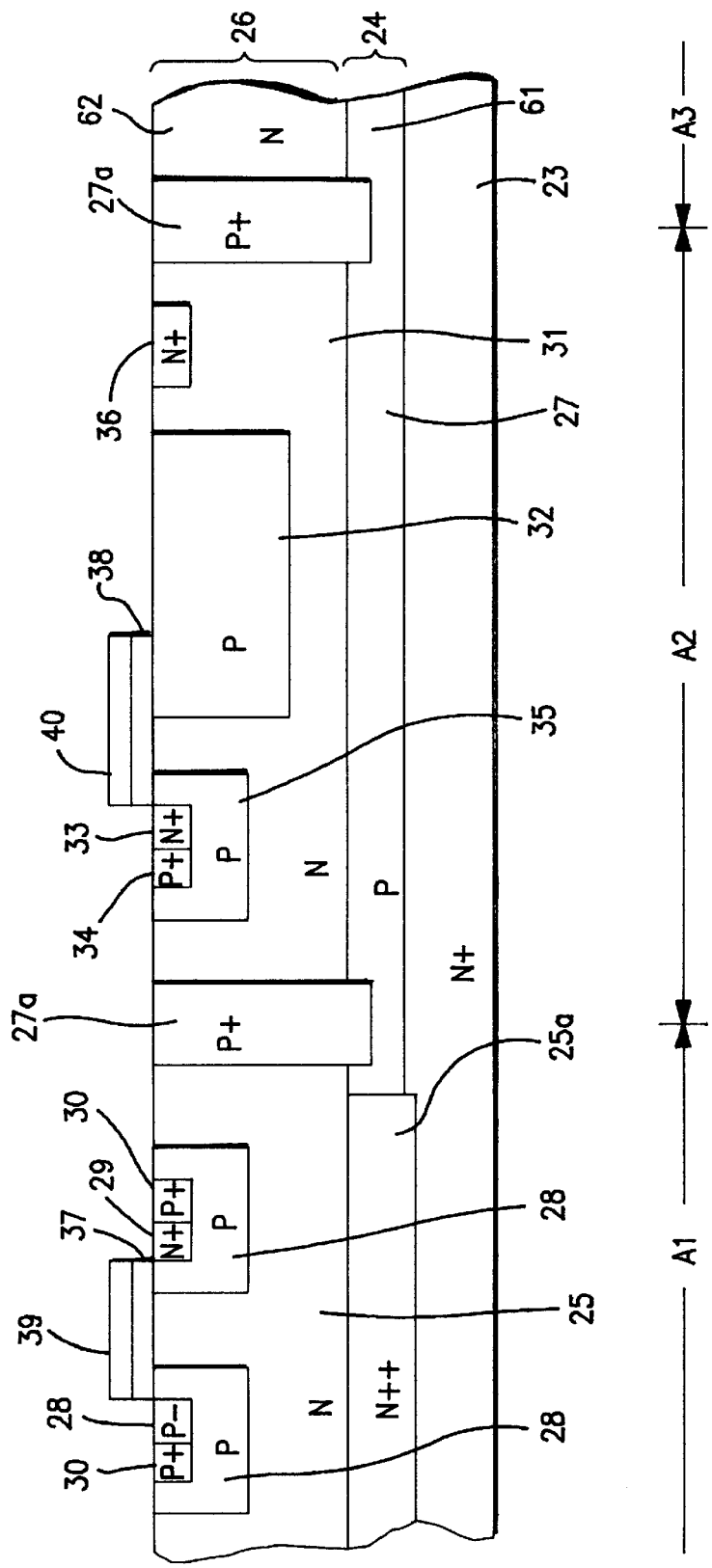

With reference to FIG. 5F, a thermal oxidation method, a chemical vapor deposition method, a photo-lithography method, a dry etching method and a wet etching method are carried out to selectively form gate oxide films 37 and 38 respectively in the first and second regions A1 and A2 for subsequent formation of gate regions 39 and 49 respectively on the gate oxide films 37 and 38. By use of the gate regions 39 and 49 as masks, a photo-lithography method, an ion-implantation method and subsequent thermal diffusion method are carried out to selectively form first $n^+$-source regions 29 in an upper region of the first p-base region 28 as well as selectively form a second $n^+$-source region 33 in an upper region of the second p-base region 35, and in addition selectively form a second $n^+$-drain region 36 in an upper region of the n-extended drain region 31, wherein the second $n^+$-drain region 36 is positioned between the p-field relaxation region 32 and the $p^+$-side isolation region 27a at the boundary between the second and third regions A2 and A3. The second $n^+$-drain region 36 is isolated by the n-extended drain region 31 from both the p-field relaxation region 32 and the $p^+$-side isolation region 27a at the boundary between the second and third regions A2 and A3. A furthermore photo-lithography method, an ion-implantation method and subsequent thermal diffusion method are carried out to selectively form first $p^+$-contact regions 30 adjacent to the first $n^+$-source regions 29 and in an upper region of the first p-base regions 28 as well as selectively form a second $p^+$-contact region 34 adjacent to the second $n^+$-source region 33 and in an upper region of the second p-base region 35.

Subsequently, the well known technique is used to complete the semiconductor device as illustrated in FIG. 4.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. A half bridge circuitry comprising a vertical MOS field effect transistor and a lateral MOS field effect transistor which are connected in series between first and second input terminals which are applied with a DC voltage, said vertical MOS field effect transistor and said lateral MOS field effect transistor being integrated on a semiconductor substrate having a first conductivity type, said vertical MOS field effect transistor and said lateral MOS field effect transistor having channels of said first conductivity type, said lateral MOS field effect transistor having a drain region of a first conductivity type surrounded by a semiconductor isolation region having a second conductivity type and comprising a laterally extending portion and a vertically extending portion so that said drain region of said lateral MOS field effect transistor is isolated by said laterally extending portion of said semiconductor isolation region from said semiconductor substrate and also isolated by said vertically extending portion of said semiconductor isolation region from said vertical MOS field effect transistor, wherein a base region of said second conductivity type is formed in an upper portion of said drain region and separated by said drain region from said semiconductor isolation region and said base region has an upper portion at which a source region is formed of said first conductivity type; and wherein a field relaxation region of said second conductivity type is formed between said base region and a drain electrode contact portion at which said drain region contacts with a drain electrode but distanced from both said base region and said drain electrode contact portion and said field relaxation region is also separated via said drain region from said laterally extending portion of said semiconductor isolation region to form a drain current channel region between said field relaxation region and said laterally extending portion of said semiconductor isolation region and further said field relaxation region is electrically connected via an interconnection to said source region and said vertically extending portion of said semiconductor isolation region so that said field relaxation region and said semiconductor isolation region have the same potential as said source region whereby if said lateral MOS field effect transistor is reverse-biased by a voltage, then a first space charge region is formed which extends from a first p-n junction surface between said laterally extending portion of said semiconductor isolation region and said drain current channel region of said drain region toward said drain current channel region and a second space charge region is formed which extends from a second p-n junction surface between said field relaxation region and said drain current channel region of said drain region toward said drain current channel region for causing said first and second space charge regions to contact with each other to pinch said drain current channel region off.

2. A drain structure of a lateral MOS field effect transistor integrated on a semiconductor substrate of a first conductivity type together with a vertical MOS field effect transistor to form a half bridge circuitry, said lateral MOS field effect transistor having a drain region of a first conductivity type being surrounded by a semiconductor isolation region having a second conductivity type and comprising a laterally extending portion and a vertically extending portion so that said drain region is isolated by said laterally extending portion from said semiconductor substrate and also isolated by said vertically extending portion from said vertical MOS field effect transistor, wherein a base region of said second conductivity type is formed in an upper portion of said drain region and separated by said drain region from said semiconductor isolation region and said base region has an upper portion at which a source region is formed of said first conductivity type; and wherein a field relaxation region of said second conductivity type is formed between said base region and a drain electrode contact portion at which said drain region contacts with a drain electrode but distanced from both said base region and said drain electrode contact portion and said field relaxation region is also separated via said drain region from said laterally extending portion to form a drain current channel region between said field relaxation region and said laterally extending portion and further said field relaxation region is electrically connected via an interconnection to a source region and said vertically extending portion so that said field relaxation region and said semiconductor isolation region have the same potential as said source region whereby if said lateral MOS field effect transistor is reverse-biased, then a first space charge region is formed which extends from a first p-n junction surface between said laterally extending portion of said semiconductor isolation region and said drain current channel region of said drain region toward said drain current channel region and a second space charge region is formed which extends from a second p-n junction surface between said field relaxation region and said drain current channel region of said drain region toward said drain current channel region for causing said first and second space charge regions to contact with each other to pinch said drain current channel region off.

* * * * *